United States Patent
Ishida et al.

(10) Patent No.: US 6,621,162 B1
(45) Date of Patent: Sep. 16, 2003

(54) HIGH FREQUENCY CIRCUIT APPARATUS

(75) Inventors: Masaaki Ishida, Chiba-ken (JP); Norio Matsui, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/662,869

(22) Filed: Sep. 15, 2000

(30) Foreign Application Priority Data

Sep. 17, 1999 (JP) .......................................... 11-263697

(51) Int. Cl.⁷ ................................................ H01L 23/34
(52) U.S. Cl. ........................ 257/728; 257/700; 257/703; 257/707; 257/734
(58) Field of Search ................................ 257/734, 700, 257/707, 758, 701–706, 728

(56) References Cited

U.S. PATENT DOCUMENTS

| | | | | |
|---|---|---|---|---|
| 4,827,327 A | * | 5/1989 | Miyauchi | 357/71 |
| 4,873,566 A | * | 10/1989 | Hokanson | 357/74 |
| 5,307,240 A | | 4/1994 | McMahon | |
| 5,523,622 A | * | 6/1996 | Harada | 257/734 |
| 5,532,514 A | * | 7/1996 | Kozono | 257/728 |
| 5,796,165 A | | 8/1998 | Yoshikawa et al. | |
| 5,874,321 A | | 2/1999 | Templeton, Jr. et al. | |
| 5,973,928 A | * | 10/1999 | Blasi | 361/760 |
| 5,977,631 A | * | 11/1999 | Notani | 257/728 |
| 6,384,479 B1 | * | 5/2002 | Yamamoto | 257/728 |

FOREIGN PATENT DOCUMENTS

| | | | |
|---|---|---|---|
| JP | 357037860 A | * | 3/1982 |
| JP | 11-17349 | | 1/1999 |

* cited by examiner

*Primary Examiner*—Long Pham
*Assistant Examiner*—Nathan W. Ha
(74) *Attorney, Agent, or Firm*—Oblon, Spivak, McClelland, Maier & Neustadt, P.C.

(57) ABSTRACT

A high frequency circuit apparatus whose thermal dissipation characteristics is excellent and which is advantageous in the compact design and in the massproductivity is provided. The high frequency circuit apparatus comprises a multilayer substrate 12 in which direct current circuit patterns 16 and 17 for transferring direct current signals are formed on an upper substrate 121 of the multilayer substrate 12 while a high frequency current circuit pattern 18 for transferring high frequency signals is formed on a lower substrate located lower than the upper substrate.

10 Claims, 3 Drawing Sheets

HIGH FREQUENCY CIRCUIT APPARATUS

CROSS REFERENCE TO THE RELATED APPLICATION

The subject application is related to subject matter disclosed in the Japanese Patent Application No.Hei11-263697 filed in Sep. 17, 1999 in Japan, to which the subject application claims priority under the Paris Convention and which is incorporated by reference herein.

BACKGROUND OF THE INVENTION

1. Field of the Invention

The present invention is related to an improved receiver/transmitter apparatus by making use of frequencies of microwaves, millimeter waves or the like.

2. Description of the Related Art

A high frequency circuit apparatus in accordance with a conventional technique will be explained with reference to FIG. 1 which is a cross sectional view thereof. The reference 31 designates a base structure constituting the bottom section of a metallic case for example. On the base structure 31, a high frequency circuit portion 32 and a direct current circuit portion 33 are implemented.

The high frequency circuit portion 32 is composed of a carrier plate 321, high frequency circuit elements 322 such as MMICs, FETs and so forth which serve to process high frequency signals and which are located in the carrier plate 321, and a high frequency substrate 323 which are located in the peripheral location of the high frequency circuit elements 322. A circuit patterns 324 such as strip lines for transferring high frequency signals is formed on the principal surface of the high frequency substrate 323 while a ground electrode 325 is formed on the rear surface of the high frequency substrate 323. The ground electrode 325 of the high frequency substrate 323 is joined to the carrier plate 321. The high frequency circuit elements 322 and the circuit pattern 324 are connected to each other by means of wirings W while the circuit pattern 324 and the ground electrode 325 are electrically connected to each other via through halls 326.

The direct current circuit portion 33 is composed of a direct current substrate 331, direct current elements 332 such as condenser chips, resistors and so forth which are located on the direct current substrate 331, a circuit pattern 333 located on the surface of the direct current substrate 331, and a ground electrode 334 formed on the rear surface of the direct current substrate 331. The ground electrode 334 of the direct current substrate 331 is joined to the base structure 31. The circuit pattern 333 formed on the principal surface of the direct current substrate 331 is electrically connected to the ground electrode 334 formed on the rear surface of the direct current substrate 331 via through halls 335.

In the case of the above explained configuration, the high frequency circuit portion 32 and the direct current circuit portion 33 are formed separate from each other while the circuit pattern 324 of the high frequency circuit portion 32 and the circuit pattern 333 of the direct current circuit portion 33 is electrically connected to each other, for example, by means of the wirings W made of gold strips.

Next, another example of the high frequency circuit apparatus in accordance with a conventional technique will be explained with reference to FIG. 2.

The reference 41 designates a base structure constituting the bottom section of a metallic case for example. A multilayer substrate 42 is located on the base structure 41. The multilayer substrate 42 is composed of first to third substrates 421, 422 and 423 which are layered in this order from the top. High frequency circuit elements 43 such as MMICs, FETs and so forth are located in the center position together with direct current elements 44 such as condenser chips, resistors and so forth which are located on both sides of the high frequency circuit elements 43 and a circuit pattern 45 for transferring high frequency signals and direct current signals.

For example, circuit patterns 46 and 47 for transferring direct current signals are provided respectively between the first substrate 421 and the second substrate 422 and between the second substrate 422 and the third substrate 423. A ground electrode 48 is formed on the rear surface of the third substrate 423 while the ground electrode 48 is joined to the base structure 41.

The high frequency circuit elements 43 and the circuit pattern 45 are electrically connected to each other by means of the wirings W while the through halls 49 serve to electrically connect the circuit patterns 45 to 47 to each other and serve to electrically connect the ground electrode 48 and the circuit patterns 45 to 47 respectively.

In the case of the high frequency circuit apparatus in accordance with the conventional technique as illustrated in FIG. 1, when the circuit scale of the system is increased, the lengths of the wirings for supplying a bias voltage are increased resulting in an increased size of the apparatus. Furthermore, the use of an appropriate package, an appropriate shield plate or the like becomes inevitable so that it is difficult to put the high frequency circuit apparatus into commercial production and cut down the price.

In the case of the high frequency circuit apparatus in accordance with the conventional technique as illustrated in FIG. 2, the substrate on which the circuit patterns for transferring high frequency signals and direct current signals is multilayered. For this reason, the packing density can be increased and it is possible to form the apparatus in a smaller size. However, since the high frequency circuit elements are formed on an upper layer, heat has to be dissipated to the base structure through a plurality of the substrates which possess a little capability of radiating heat when it is need to dissipate heat as generated by the high frequency circuit elements such as power amplifier elements. Because of this, it is impossible to obtain an excellent thermal dissipation characteristics.

SUMMARY OF THE INVENTION

The present invention has been made in order to solve the shortcomings as described above. It is an object of the present invention to provide a high frequency circuit apparatus which is provided with excellent thermal dissipation characteristics and which is advantageous in shrinking the size and in improving the massproductivity.

In brief, the above and other objects and advantages of the present invention are provided by a new and improved high frequency circuit apparatus comprising:

a multilayer structure consisting of a plurality of insulating layers and a plurality of conductive layers, said insulating layers and said conductive layer being layered alternately with each other; and a plurality of signal processing circuits provided on said multilayer structure and connected to each other by means of said conductive layer, wherein said signal processing circuits include at least one high frequency circuit device driven at a high frequency and at least one low frequency circuit device driven at a low frequency lower than said high frequency; and wherein at least part of said low frequency circuit is located on an upper layer of said multilayer structure while said high frequency circuit is located on a lower layer of said multilayer structure lower than said upper layer.

In a preferred embodiment, further improvement resides in that said multilayer structure is composed of a supporting base substrate and a multilayer substrate mounted on said supporting base substrate.

In a preferred embodiment, further improvement resides in that said high frequency circuit device is provided on said supporting base substrate.

In a preferred embodiment, further improvement resides in that said high frequency circuit device is provided on said supporting base substrate through a conductive film.

In a preferred embodiment, further improvement resides in that said conductive layers are composed of conductive patterns.

In accordance with a further aspect of the present invention, the above and other objects and advantages of the present invention are provided by a new and improved high frequency circuit apparatus comprising:

a multilayer structure consisting of a plurality of insulating layers and a plurality of conductive pattern layers, said insulating layers and said conductive pattern layer being layered alternately with each other; and signal processing circuitry provided on said multilayer structure and connected to each other by means of said conductive pattern layer, wherein said high frequency circuit apparatus is driven with high and low frequency signals; and wherein said low frequency signal is transferred through an upper layer of said multilayer structure while said high frequency signal is transferred through a lower layer of said multilayer structure located lower than said upper layer.

In a preferred embodiment, further improvement resides in that said multilayer structure is composed of a supporting base substrate and a multilayer substrate mounted on said supporting base substrate.

BRIEF DESCRIPTION OF DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION OF EMBODIMENTS

Figure 1:
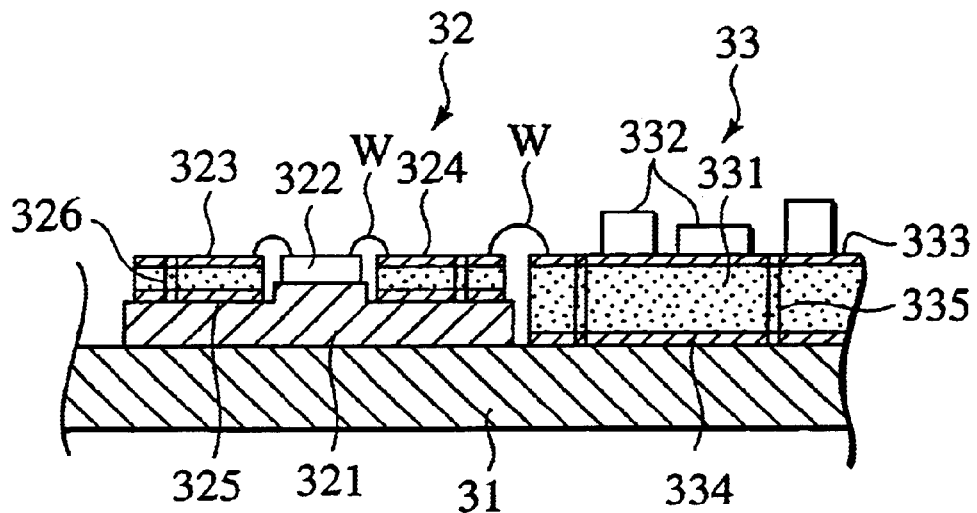
FIG. 1 is a cross sectional view for explaining an exemplary prior art technique.
Figure 2:
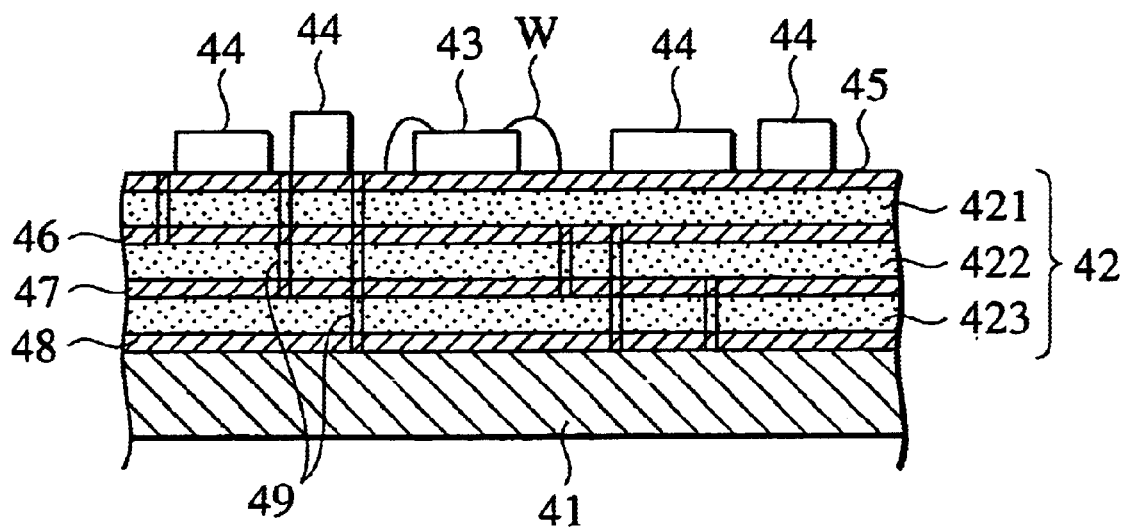
FIG. 2 is a cross sectional view for explaining another exemplary prior art technique.

The present invention is related to a high frequency circuit apparatus which is driven at very high frequencies which are no lower than 10 GHz such as the KU band, i.e., 12 to 14 GHz for use in BS converters or CS converters, 20 to 40 GHz for use in PTMP (Point-to-MultiPoint) communication systems and so forth. Particularly, the embodiment of the present invention as explained in the followings is directed to a receiver/transmitter device implemented within a PTMP communication system.

An embodiment in accordance with the present invention will be explained with reference to FIG. 3. The reference 11 designates a base structure constituting a metallic case for sealing semiconductor elements and the like in an air-tight manner. A multilayer substrate 12 is located on the base structure 11. The multilayer substrate 12 is composed of first through third substrates 121, 122 and 123 located in this order from the top. The rear surface of the substrate 123 located in the most lower position of the multilayer substrate 12 is provided, for example, with a ground electrode 13 on the entirety thereof. Openings 14 are formed through the substrates 121, 122 and 123 of the multilayer substrate 12 in order to partially expose the ground electrode 13 and either of the substrates 122 and 123. The multilayer substrate 12 is joined to the base structure 11 through the ground electrode 13.

The direct current elements 15 such as condenser chips, resistors and so forth are located the surface of the multilayer substrate 12, e.g., on the first substrate 121 as well as the direct current circuit pattern 16 for transferring direct current signals. The rear surface of the first substrate 121 or the surface of the second substrate 122 are provided with the direct current circuit pattern 17 for transferring direct current signals are formed. The high frequency current circuit pattern 18 for transferring high frequency current signals are formed on either of the rear surface of second substrate 122 and the surface of the third substrate 123. Meanwhile, the circuit patterns 16 to 18 are electrically connected to each other through the through halls 19, which also serve to electrically connect the circuit patterns 16 to 18 and the ground electrode 13 respectively.

High frequency circuit elements 20 such as MMICs, FETs and so forth which serve to process high frequency signals are located on the ground electrode 13 which is located within the opening 14 of the multilayer substrate 12 while the high frequency circuit elements 20 is joined to the high frequency current circuit pattern 18 by means of wirings W. The opening 14 is covered with a metallic shield plate 21 in order to magnetoelectrically shield the high frequency circuit elements 20. In this case, the periphery of the shield plate 21 is connected to the circuit pattern portion which is ground and formed on the substrate 121 located in the uppermost position.

Figure 4:
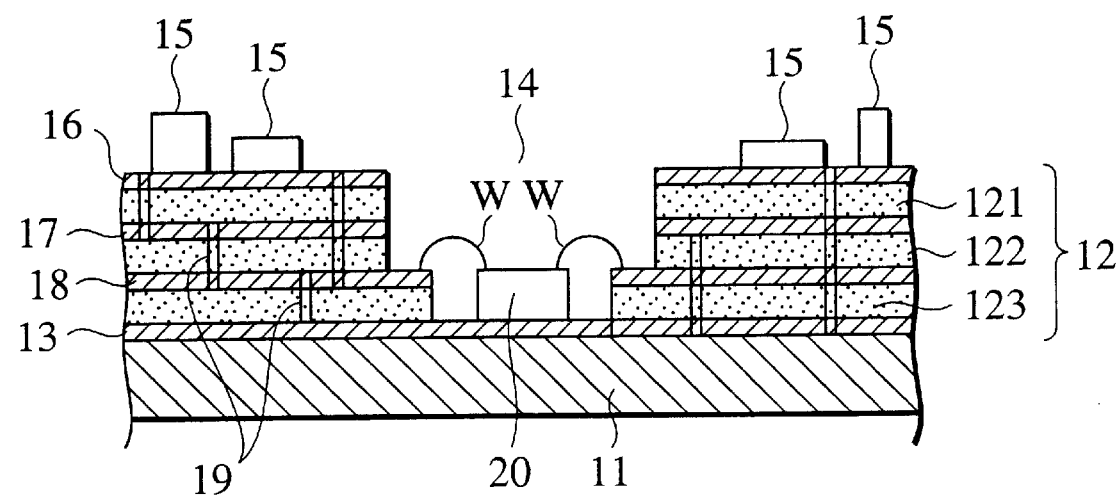
FIG. 4 is a cross sectional view for explaining another embodiment in accordance with the present invention.
Figure 5:
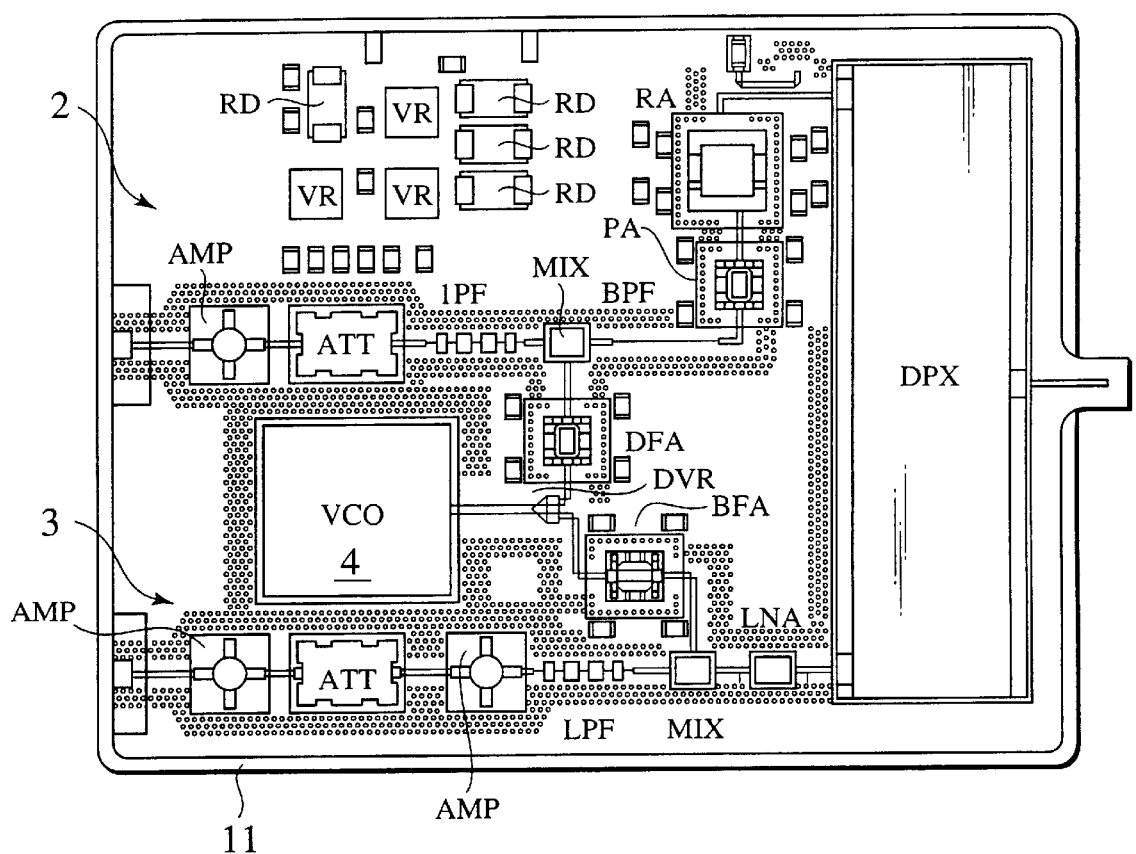
FIG. 5 is an external view showing the actual layout of a practical receiver/transmitter device in accordance with this embodiment.

FIG. 5 is an external view showing the actual layout of a practical receiver/transmitter device in accordance with this embodiment. For example, the base structure 11 is made up of copper in the form of a shallow bathtub in which the substrate as illustrated in FIG. 3 or FIG. 4 is attached to the bottom thereof. In the figure, there is illustrated the circuit board structure 11 consisting of the transmitter circuit 2 (a voltage-controlled oscillator), the receiver circuit 3 and the local oscillator 4 as well as some auxiliary circuits. Although only one opening is illustrated in FIG. 3 or FIG. 4, there are provided a plurality of similar openings in practice in accordance with the number of the high frequency circuit elements such as the local oscillator 4 and so forth. In FIG. 5, there are illustrated a plurality of semiconductor chips. These chips are mounted directly on the base structure 11 through a plurality of openings. Also, as illustrated in FIG. 3 or FIG. 4, the substrate 121 and the substrate 122 are opened to a wider extent than the third substrate 123 in order that part of the high frequency current circuit pattern 18 of the third substrate 123 is exposed for making it possible to directly connect wirings W with the high frequency current circuit pattern 18. Also, the substrates 121, 122 and 123 are insulating substrates formed of a dielectric film, for example, a polytetrafluoroethylene film, respectively, on which the ground electrode 13 and the circuit patterns 16, 17 and 18 are formed of a copper foil.

When the high frequency circuit apparatus as described above is assembled, the direct current elements 15, the high frequency circuit elements 20 and the like are mounted on the multilayer substrate 12 and then joined to the base structure 11 through the ground electrode 13 of the multilayer substrate 12. The base structure 11 is covered with a lid (not shown in the figure) which is connected to the periphery of the base structure 11 surrounding the multilayer substrate 12 in order to seal the high frequency circuit elements 20 and so forth in an air-tight manner.

In accordance with the configuration as described above, there is provided a multilayer substrate having a plurality of constituent substrates. A direct current circuit pattern is formed on the surface of an upper substrate selected among from the constituent substrates for transferring direct current signals while a high frequency current circuit pattern is formed on a lower substrate selected among from the constituent substrates for transferring high frequency signals. Also, the through halls serve to electrically connect the direct current circuit patterns to each other, connect the direct current circuit pattern to the high frequency current circuit pattern and vice versa, and connect the direct current circuit pattern and the high frequency current circuit pattern to the ground electrode.

In this case, there is no need for any additional parts for connection so that it is possible to decrease the size of the high frequency circuit apparatus and improve the massproductivity. Furthermore, since the direct current circuit patterns and the high frequency current circuit patterns are located overlapping each other, it is possible to increase the packing density and to decrease the size of the high frequency circuit apparatus. Furthermore, since the high frequency circuit elements is located on the ground electrode which is contact with the base structure without any intervening substrate between the high frequency circuit elements and the base structure, it is possible to effectively transfer thermal energy as generated by the high frequency circuit elements to the base structure resulting in excellent thermal dissipation characteristics.

Next, another embodiment of the present invention will be explained with reference to FIG. 4. In FIG. 4, like references are used to indicate corresponding elements to those as illustrated in FIG. 3 and therefore redundant explanation is partially dispensed with.

In this embodiment, the opening 14 is formed passing through the multilayer substrate 12. In this case, the base structure 11 is exposed through the opening 14 of the multilayer substrate 12 which is joined to the base structure 11. The high frequency circuit element 20 is directly mounted on the base structure 11 as exposed. For this reason, thermal energy as generated by the high frequency circuit elements is transferred directly to the base structure 11 so that it is possible to obtain better thermal dissipation characteristics as compared with the configuration illustrated in FIG. 1.

Meanwhile, in the respective embodiments as described above, it is possible to improve the magnetoelectric shielding characteristics of the high frequency circuit portion by forming and grounding conductive layers on the substrate surfaces between which is located the high frequency current circuit pattern, for example, on the entire areas of the two substrate surfaces located above and below the high frequency current circuit pattern.

In the case of the embodiment as explained above, the multilayer substrate is composed of three layers. However, the present invention is not limited to the multilayer substrate consisting of three layers but is applicable also to the case that the multilayer substrate is composed of four or more layers as laminated.

In consequence, in accordance with the present invention, it is possible to obtain an improved high frequency circuit apparatus whose thermal dissipation characteristics is excellent and which is advantageous in the compact design and in the massproductivity.

Meanwhile, the high frequency circuit apparatuses as described above can be manufactured by means of conventional manufacturing processes so that the skilled in the art can easily manufacture the high frequency circuit apparatuses without further information. In the case of the high frequency circuit apparatus as illustrated in FIG. 3, the direct current elements 15 such as condenser chips, resistors and so forth, the direct current circuit pattern 17 for transferring direct current signals and the high frequency circuit elements 20 such as MMICs, FETs and so forth which serve to process high frequency signals are mounted on the multilayer substrate 12 prepared separate from the base structure 11, followed by necessary connection by means of the wirings W. Thereafter, the multilayer substrate 12 is attached to the base structure 11.

Figure 3:
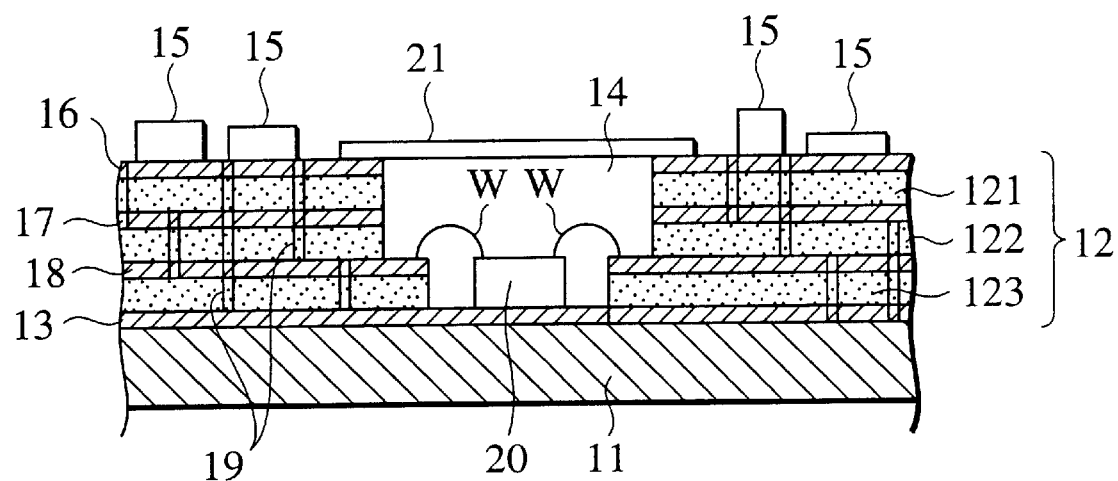
FIG. 3 is a cross sectional view for explaining an embodiment in accordance with the present invention.

On the other hand, in the case of the high frequency circuit apparatus as illustrated in FIG. 3, the direct current elements 15 such as condenser chips, resistors and so forth, the direct current circuit pattern 17 for transferring direct current signals are mounted on the multilayer substrate 12 prepared separate from the base structure 11, followed by attaching the multilayer substrate 12 to the base structure 11 in advance of mounting the high frequency circuit elements 20. Thereafter, the high frequency circuit elements 20 such as MMICs, FETs and so forth which serve to process high frequency signals are mounted on the base structure 11, followed by necessary connection by means of the wirings W.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

For example, in accordance with the embodiment as described above, the signal processing circuits include the direct current circuit portion and the high frequency circuit portion. However, it will be understood that the technical gist of the present invention is effective in the case that the direct current circuit portion is replaced by a low frequency circuit portion in the above description in which the low frequency circuit is driven at a low frequency so that a relatively small amount of heat is generated therefrom.

Also, in accordance with the embodiment as described above, the direct current circuit portion is located on the upper surface while the high frequency circuit portion is located on the lower surface. However, it will be understood that the technical gist of the present invention is effective in the case that part of the direct current circuit portion is located also on the lower surface.

What is claimed is:

1. A high frequency circuit apparatus comprising:
   a multilayer structure having a plurality of insulating layers, a plurality of conductive pattern layers, and a supporting base substrate, said insulating layers and said conductive pattern layers being layered alternately with each other on said supporting base substrate; and
   signal processing circuitry provided on said multilayer structure and connected to each other by means of said conductive pattern layers,
   wherein said high frequency circuit apparatus is driven with high and low frequency signals,
   wherein said low frequency signal is transferred through a low frequency current circuit pattern layer located in an upper layer of said multilayer structure while said high frequency signal is transferred through a high frequency current circuit pattern layer located in a lower layer of said multilayer structure located lower than said upper layer, and
   wherein a ground electrode is provided in a layer located lower than said lower layer.

2. A high frequency circuit apparatus comprising:
   a multilayer structure including a plurality of insulating layers, a plurality of conductive layers, and a supporting base substrate, said insulating layers and said conductive layers being layered alternately with each other on said supporting base substrate; and
   a plurality of signal processing circuits provided on said multilayer structure and connected to each other by means of said conductive layers,
   wherein said signal processing circuits include a high frequency circuit driven at a high frequency and a low frequency circuit driven at a low frequency lower than said high frequency, and
   wherein said low frequency circuit is located on an upper layer of said multilayer structure while said high frequency circuit is located on a lower layer of said multilayer structure lower than said upper layer.

3. The high frequency circuit apparatus as claimed in claim 2, wherein said high frequency circuit device is provided on said supporting base substrate.

4. The high frequency circuit apparatus as claimed in claim 3 wherein said high frequency circuit device is provided on said supporting base substrate through a conductive film.

5. The high frequency circuit apparatus as claimed in claim 2, wherein said conductive layers are composed of conductive patterns.

6. The high frequency circuit apparatus as claimed in claim 2, wherein said high frequency circuit includes a high frequency circuit device mounted on said multilayer structure through a ground electrode.

7. The high frequency circuit apparatus as claimed in claim 2, wherein said high frequency circuit includes an MMIC or an FET which is joined to a high frequency current circuit pattern by wirings in a lower layer of said multilayer structure lower than an upper layer in which a low frequency current circuit pattern is formed.

8. A high frequency signal processing apparatus comprising:
   a multilayer structure including a plurality of insulating layers layered alternately with a plurality of conductive layers on a heat dissipating supporting base;
   high frequency signal processing circuitry including one of said conductive layers carrying high frequency signals supported by the heat dissipating supporting base; and
   low frequency signal processing circuitry including one of said conductive layers carrying low frequency signals supported by the heat dissipating supporting base,
   wherein said high frequency processing circuitry generates more heat than said low frequency signal processing circuitry and is positioned relative to the heat dissipating supporting base so as to more effectively transfer heat to said heat dissipating supporting base than said low frequency signal processing circuitry.

9. A high frequency signal processing apparatus comprising:
   a multilayer structure including a plurality of insulating layers layered alternately with a plurality of conductive layers on a heat dissipating supporting base;
   high frequency signal processing circuitry including one of said conductive layers carrying high frequency signals supported by the heat dissipating supporting base; and
   low frequency signal processing circuitry including one of said conductive layers carrying low frequency signals supported by the heat dissipating supporting base,
   wherein said multilayer structure is configured so that said high frequency processing circuitry transfers heat more effectively to the heat dissipating supporting base than said low frequency signal processing circuitry.

10. A high frequency signal processing apparatus comprising:
    a multilayer structure including a plurality of insulating layers layered alternately with a plurality of conductive layers on a heat dissipating supporting base;
    means for high frequency signal processing including one of said conductive layers carrying high frequency signals; and
    means for low frequency signal processing including one of said conductive layers carrying low frequency signals supported by the heat dissipating supporting base,
    wherein the means for high frequency signal processing is positioned relative to the heat dissipating supporting base for more effective heat transfer thereto than the heat transfer thereto from the means for low frequency signal processing.

* * * * *